(12) United States Patent
Kang et al.

(10) Patent No.: US 11,943,968 B2
(45) Date of Patent: Mar. 26, 2024

(54) DISPLAY DEVICE AND METHOD OF MANUFACTURING THE SAME

(71) Applicant: Samsung Display Co., Ltd., Yongin-Si (KR)

(72) Inventors: Minsoo Kang, Yongin-si (KR); Gwangjae Seo, Cheonan-si (KR); Myeongseok Jeong, Cheonan-si (KR); Yongsik Heo, Asan-si (KR); Kyoungil Min, Hwaseong-si (KR); Junshik Park, Incheon (KR); Taehyun Sung, Seoul (KR); Hyungu Lee, Asan-si (KR)

(73) Assignee: SAMSUNG DISPLAY CO., LTD., Yongin-si (KR)

( * ) Notice: Subject to any disclaimer, the term of this patent is extended or adjusted under 35 U.S.C. 154(b) by 0 days.

(21) Appl. No.: 17/967,363

(22) Filed: Oct. 17, 2022

(65) Prior Publication Data

US 2023/0035717 A1    Feb. 2, 2023

Related U.S. Application Data

(63) Continuation of application No. 16/879,988, filed on May 21, 2020, now Pat. No. 11,476,449, which is a
(Continued)

(30) Foreign Application Priority Data

Jun. 10, 2016  (KR) .......................... 10-2016-0072736

(51) Int. Cl.
*H10K 71/00* (2023.01)
*G02F 1/1333* (2006.01)
*G02F 1/1335* (2006.01)
*H01L 21/84* (2006.01)
*H01L 27/12* (2006.01)
*H10K 50/80* (2023.01)
*H10K 50/844* (2023.01)

(52) U.S. Cl.
CPC ..... *H10K 50/868* (2023.02); *G02F 1/133351* (2013.01); *G02F 1/133528* (2013.01); *H01L 21/84* (2013.01); *H01L 27/1248* (2013.01); *H10K 50/844* (2023.02); *H10K 71/00* (2023.02)

(58) Field of Classification Search
None
See application file for complete search history.

(56) References Cited

U.S. PATENT DOCUMENTS 8,222,804 B2    7/2012  Miller et al.
8,792,252 B2    7/2014  Hwang et al.
(Continued)

FOREIGN PATENT DOCUMENTS

CN    101408634    4/2009
CN    103544885    1/2014
(Continued)

*Primary Examiner* — Benjamin P Sandvik
(74) *Attorney, Agent, or Firm* — KILE PARK REED & HOUTTEMAN PLLC

(57) ABSTRACT

A display device includes a display panel, a first film, and a polarizing film. The display panel includes a first surface, a second surface opposite to the first surface, and a side surface. The first film is beneath the first surface of the display panel. The polarizing film is on the second surface of the display panel. The polarizing film has a haze area including a yellow area extending along an edge of the polarizing film in a plan view.

20 Claims, 20 Drawing Sheets

Related U.S. Application Data continuation of application No. 15/418,848, filed on Jan. 30, 2017, now Pat. No. 10,686,161.

(56) References Cited

U.S. PATENT DOCUMENTS

| | | |
|---|---|---|
| 9,102,007 B2 | 8/2015 | Hosseini |
| 9,419,243 B2 | 8/2016 | Park et al. |
| 9,673,014 B2 | 6/2017 | Kim et al. |
| 9,759,950 B2 | 9/2017 | Kim et al. |
| 10,686,161 B2 | 6/2020 | Kang et al. |
| 2006/0275989 A1 | 12/2006 | Ting et al. |
| 2007/0046874 A1 | 3/2007 | Adachi et al. |
| 2008/0220151 A1 | 9/2008 | Kataoka |
| 2010/0252599 A1 | 10/2010 | Nakano et al. |
| 2011/0080088 A1 | 4/2011 | Hara et al. |
| 2011/0128477 A1 | 6/2011 | Izaki et al. |
| 2013/0039094 A1 | 2/2013 | Kolb et al. |
| 2013/0169515 A1 | 7/2013 | Prushinskiy et al. |
| 2013/0344768 A1 | 12/2013 | Lee et al. |
| 2014/0094079 A1 | 4/2014 | Ito et al. |
| 2014/0134763 A1 | 5/2014 | Park et al. |
| 2014/0204293 A1 | 7/2014 | Kim et al. |
| 2015/0206926 A1 | 7/2015 | Hong et al. |
| 2015/0264805 A1 | 9/2015 | Chen et al. |
| 2015/0340640 A1 | 11/2015 | Kang et al. |
| 2015/0340661 A1 | 11/2015 | Sakamoto et al. |
| 2016/0147109 A1 | 5/2016 | Yamazaki et al. |
| 2016/0190389 A1 | 6/2016 | Lee et al. |
| 2017/0005291 A1 | 1/2017 | Sung et al. |
| 2017/0153472 A1 | 6/2017 | Go et al. |

FOREIGN PATENT DOCUMENTS

| | | |
|---|---|---|
| CN | 103969867 | 8/2014 |
| CN | 104167424 | 11/2014 |
| JP | 2011-107556 | 6/2011 |
| JP | 2013-186984 | 9/2013 |
| JP | 2014-21498 | 2/2014 |
| JP | 2014-142612 | 8/2014 |
| KR | 10-2010-0036069 | 4/2010 |
| KR | 10-2010-0108047 | 10/2010 |
| KR | 10-2011-0059522 | 6/2011 |
| KR | 10-2011-0083880 | 7/2011 |
| KR | 2011-0096122 | 8/2011 |
| KR | 10-2014-0055608 | 5/2014 |
| KR | 10-2014-0095621 | 8/2014 |
| KR | 10-2015-0043605 | 4/2015 |
| KR | 10-2015-0096691 | 8/2015 |
| KR | 10-2016-0063251 | 6/2016 |
| TW | 201521931 | 6/2015 |
| TW | 201617655 | 5/2016 |
| WO | 2014097885 | 6/2014 |

DISPLAY DEVICE AND METHOD OF MANUFACTURING THE SAME

CROSS-REFERENCE TO RELATED APPLICATION

This is a continuation application based on currently U.S. patent application Ser. No. 16/879,988, filed May 21, 2020, the disclosure of which is incorporated herein by reference in its entirety. U.S. patent application Ser. No. 16/879,988 is a continuation application of U.S. patent application Ser. No. 15/418,848, filed Jan. 30, 2017, now U.S. Pat. No. 10,686,161, issued Jun. 16, 2020, the disclosure of which is incorporated herein by reference in its entirety. U.S. patent application Ser. No. 15/418,848 claims priority benefit, under 35 U.S.C. § 119, of Korean Patent Application No. 10-2016-0072736, filed on Jun. 10, 2016 in the Korean Intellectual Property Office, the disclosure of which is incorporated herein by reference in its entirety for all purposes.

BACKGROUND

1. Field

One or more embodiments described herein relate to a display device and a method for manufacturing a display device.

2. Description of the Related Art

Each pixel of an organic light emitting display device may include a circuit for controlling an organic light emitting diode. The circuit includes a control transistor, a driving transistor, and a storage capacitor. The organic light emitting diode includes an organic light emitting layer between anode and cathode electrodes. The organic light emitting diode emits light when a voltage greater than a threshold voltage of the organic light emitting layer is applied between the anode and cathode electrodes.

SUMMARY

In accordance with one or more embodiments, a display device includes a display panel including a light emitter to emit light including display information, a first surface, and a second surface opposite to the first surface, the light to pass through a second surface; a first film on the first surface of the display panel; and a second film on the second surface of the display panel, wherein the display panel includes a side surface that connects the first surface and the second surface, wherein a side surface of the second film protrudes outwardly more than a side surface of the first film with respect to the side surface of the display panel, and wherein the side surface of the second film is inclined at an angle greater than about 90 degrees with respect to the second surface.

The side surface of the display panel may protrude outwardly more than the side surface of the first film. The side surface of the display panel and the side surface of the first film may be inclined at an angle less than about 90 degrees with respect to the second surface. An inclined angle of the side surface of the display panel and the second surface may be equal to or less than an inclined angle of the side surface of the first film and the second surface.

The display device may include a first pressure sensitive adhesive that adheres the first film to the first surface of the display panel; and a second pressure sensitive adhesive that adheres the second film to the second surface of the display panel. The first film may support the display panel and the second film may be a polarizing film.

The display device may include a protective film that protects the second film; a lower support film under the first film; and a third pressure sensitive adhesive that adheres the lower support film to the first film. A haze area may be in an upper surface of the second film adjacent to the side surface of the second film, and the haze area may have a width of from about 1 micrometer to about 100 micrometers. The light emitter may include an organic light emitter.

In accordance with one or more other embodiments, a display device includes a display panel including a light emitter to emit light including display information, a first surface, and a second surface opposite to the first surface, the light to pass through the second surface; a support film on the first surface of the display panel; and a polarizing film on the second surface of the display panel, wherein a cross-section corresponding to a side surface of the polarizing film, a side surface of the display panel, and a side surface of the support film is inclined in a direction away from a center of the display device with respect to a normal line direction of the second surface that sequentially penetrates through the support film, the display panel, and the polarizing film.

The cross-section may include a first cross-section corresponding to the side surface of the support film and the side surface of the display panel; and a second cross-section corresponding to the side surface of the polarizing film, wherein an inclined angle of the first cross-section is different from an inclined angle of the second cross-section. The inclined angle of the second cross-section may be greater than the inclined angle of the first cross-section.

The display device may include a first pressure sensitive adhesive that adheres the support film to the first surface of the display panel; and a second pressure sensitive adhesive that adheres the polarizing film to the second surface of the display panel. The display device may include a protective film that protects the polarizing film, a lower support film under the support film, and a third pressure sensitive adhesive that adheres the lower support film to the support film. A haze area may be in an upper surface of the polarizing film adjacent to the side surface of the polarizing film, and the haze area may have a width of from about 1 micrometer to about 100 micrometers. The light emitter may include an organic light emitter.

In accordance with one or more other embodiments, a method for manufacturing a display device forming a mother substrate including a plurality of display units, each of the display units including a plurality of light emitters to emit light including display information; attaching a first mother film and a second mother film to a first surface of the mother substrate and a second surface of the mother substrate, which is opposite to the first surface, respectively, to form a display mother substrate; and irradiating a laser beam on the display mother substrate from the first mother film to cut the display mother substrate in to the light emitters to form the display device, wherein the light passes through the second surface. The laser beam may be irradiated in a multi-pass process.

Irradiating the laser beam may include irradiating the laser beam with a first intensity; and irradiating the laser beam with a second intensity less than the first intensity. Irradiating the laser beam with the first intensity may be performed in a first multi-pass process, and irradiating the laser beam with the second intensity may be performed in a second multi-pass process, the second multi-pass process greater than the first multi-pass process. The first mother film and the mother substrate may be cut by irradiating the laser beam with the first intensity, and the second mother film may be cut by irradiating the laser beam with the second intensity. The first mother film may be a support film and the second mother film may be a polarizing film. The laser beam may be at least one of an ultraviolet laser beam or a carbon dioxide laser beam.

BRIEF DESCRIPTION OF THE DRAWINGS

Features will become apparent to those of skill in the art by describing in detail exemplary embodiments with reference to the attached drawings in which.

DETAILED DESCRIPTION

The following description with reference to the accompanying drawings is provided to assist in a comprehensive understanding of various embodiments of the present disclosure as defined by the claims and their equivalents. It includes various specific details to assist in that understanding but these are to be regarded as merely exemplary. Accordingly, those of ordinary skill in the art will recognize that various changes and modifications of the various embodiments described herein can be made without departing from the scope and spirit of the present disclosure. In addition, descriptions of well-known functions and constructions may be omitted for clarity and conciseness.

When an element is referred to as being "connected" or "coupled" to another element, it can be directly connected or coupled to the another element or be indirectly connected or coupled to the another element with one or more intervening elements interposed therebetween. In addition, when an element is referred to as "including" a component, this indicates that the element may further include another component instead of excluding another component unless there is different disclosure.

Figure 1:
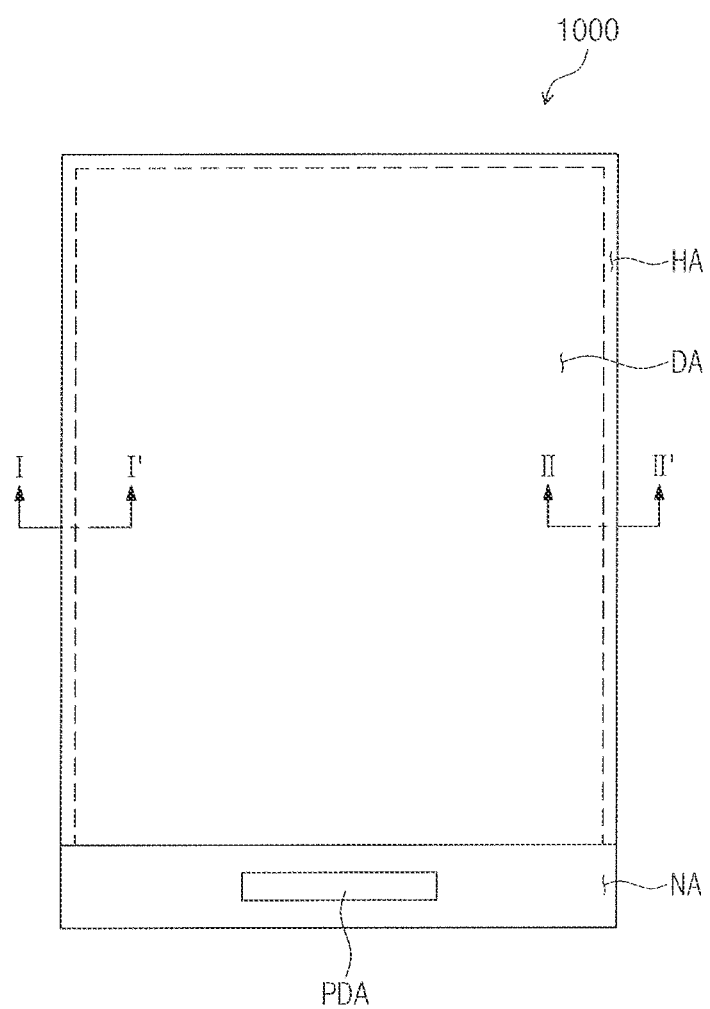
FIG. 1 illustrates an embodiment of a display device.
Figure 2:
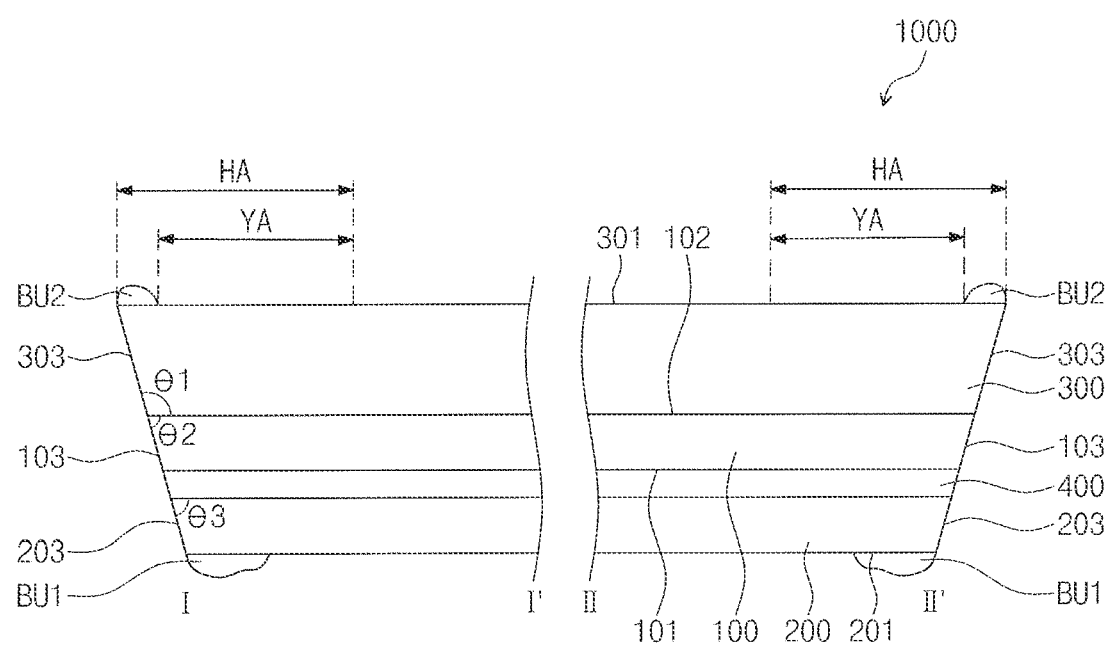
FIG. 2 illustrates a view along section lines I-I' and II-II' in FIG. 1.

FIG. 1 illustrates an embodiment of a display device 1000, and FIG. 2 is a cross-sectional view taken along lines I-I' and II-II' in FIG. 1. Referring to FIG. 1, the display device 1000 includes a display area DA and a non-display area NA distinguished from the display area DA when viewed in a plan view. The display area DA displays an image, while the non-display area NA does not display an image. The non-display area NA may be adjacent to one side of the display area DA. In another embodiment, the non-display area NA may be adjacent to at least one of the other sides of the display area DA and/or more than one side of the display area.

The non-display area NA includes a pad area PDA which may be connected to a flexible printed circuit board. The display device 1000 may receive signals to drive the display device 1000 through the pad area PDA.

A haze area HA is at an edge of the display area DA. In the present exemplary embodiment, the haze area HA is at one or more sides different from the side adjacent to the non display area NA. When the non-display area NA is adjacent to another side, the position of the haze area HA may be changed accordingly.

Referring to FIG. 2, the display device 1000 includes a display panel 100, a first film 200, and a second film 300 stacked along a first direction DR1. The display panel 100 includes a display element emitting light including display information. The display element may be, but is not limited to, an organic light emitting element, a liquid crystal display element, a plasma display element, an electrophoretic display element, a microelectromechanical system display element, or an electrowetting display element. An organic light emitting element will be described below as a representative example.

The display panel 100 includes a second surface 102 opposite to a first surface 101. The display panel 100 outputs light emitted by the display element through the second surface 102. The first film 200 is on the first surface 101 of the display panel 100. The second film 300 is on the second surface 102 of the display panel 100. The display device 1000 may further include a first pressure sensitive adhesive 400 between the first film 200 and the display panel 100.

The first film 200 may be, but is not limited to, a support film to support and protect the display panel 100. The first film 200 may include polyethylene terephthalate (PET), polyethylene naphthalate (PEN), polypropylene (PP), polycarbonate (PC), polystyrene (PS), polysulfone (PSul), polyethylene (PE), polyphthalamide (PPA), polyethersulfone (PES), polyarylate (PAR), polycarbonate oxide (PCO), or modified polythenylene oxide (MPPO). In the present exemplary embodiment, the first film 200 includes polyethylene terephthalate (PET).

The second film 300 may include a polarizing film to block external light incident thereto. The polarizing film may include a linear polarizing layer and a $\lambda/4$ retardation layer. The linear polarizing layer may be on, for example, the $\lambda/4$ retardation layer. External light sequentially passing through the linear polarizing layer and the $\lambda/4$ retardation layer is reflected by a lower portion (e.g., a cathode of the display panel 100) of the polarizing film. Then, the external light is suppressed since the external light does not pass through the linear polarizing layer after passing through the $\lambda/4$ retardation layer.

The first pressure sensitive adhesive 400 adheres the first film 200 to the first surface 101. The first pressure sensitive adhesive 400 includes, for example, an urethane-based material, an acrylic-based material, or a silicon-based material.

The display panel 100 further includes a side surface 103 connecting the first surface 101 and the second surface 102.

A side surface 303 of the second film 300 may protrude outwardly along a second direction DR2 than a side surface 203 of the first film 200 and the side surface 103 of the display panel 100. In addition, the side surface 103 of the display panel 100 may protrude outwardly along the second direction DR2 more than the side surface 203 of the first film 200.

Accordingly, each of the side surface 203 of the first film 200, the side surface 103 of the display panel 100, and the side surface 303 of the second film 300 may be inclined at a predetermined angle and, for example, aligned to form a continuous slanted side surface. The angle between the side surface 303 of the second film 300 and the second surface 102 may be referred to as a first inclination angle θ1. The first inclination angle θ1 may be greater than a predetermined angle, e.g., about 90 degrees.

An angle between the side surface 103 of the display panel 100 and the second surface 102 may be referred to as a second inclination angle θ1. An angle between an extension line of the side surface 203 of the first film 200 and the second surface 102 may be referred to as a third inclination angle θ3. In one embodiment, the second and third inclination angles θ1 and θ3 may be less than a predetermined angle (e.g., less than about 90 degrees). The second and third inclination angles θ1 and θ3 may be equal or different.

A first burr BU1 is on a lower surface 201 of the first film 200 and adjacent to the side surface 203 of the first film 200. A second burr BU2 is on an upper surface 301 of the second film 300 and adjacent to the side surface 303 of the second film 300. In one embodiment, the first and second burrs BU1 and BU2 may have different sizes, e.g., the second burr BU2 may be smaller than the first burr BU1.

A yellow area YA may be in the lower surface 201 of the first film 200 and the upper surface 301 of the second film 300 and adjacent to the first and second burrs BU1 and BU2. FIG. 2 shows only the yellow area YA in the upper surface 301 of the second film 300 for illustrative purposes.

The haze area HA may correspond to an area which includes the area in which the second burr BU2 is formed and the yellow area YA. As an example, the haze area HA has a width of from about 1 micrometers to about 100 micrometers.

When a direction vertical to the first and second surfaces 101 and 102 of the display panel 100 and toward the second surface 102 from the first surface 101 is a first direction DR1, a direction vertical to the first direction DR1 may be a second direction DR2. The width of the haze area HA may correspond to a width in the second direction DR2 of the haze area HA when the display panel 100 is cut along a direction vertical to two parallel sides.

Figure 3:
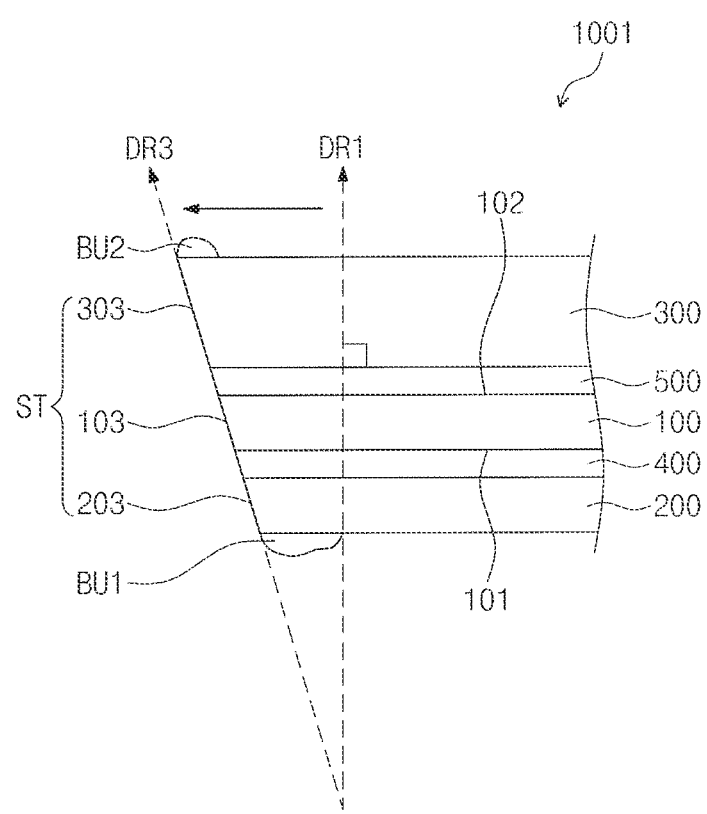
FIG. 3 illustrates another embodiment of a display device.

FIG. 3 is a cross-sectional view of another embodiment of a display device 1001 which further includes a second pressure sensitive adhesive 500. The second pressure sensitive adhesive 500 is between the second surface 102 of the display panel 100 and the second film 300 to adhere the second film 300 to the second surface 102. The second pressure sensitive adhesive 500 includes, for example, an urethane-based material, an acryl-based material, or a silicon-based material.

The side surface 203 of the first film 200, the side surface 103 of the display panel 100, and the side surface 303 of the second film 300 may correspond to a cross-section ST of the display device 100. The cross-section ST may be inclined with respect to a normal line direction, e.g., the first direction DR1, of the second surface 102, which sequentially penetrates through the first film 200, the display panel 100, and the second film 300.

The cross-section ST is inclined outwardly away from a center of the display device 1001 with respect to the first direction DR1. FIG. 3 shows only a left cross-section ST of the display device 1001, but a right cross-section may be symmetrical with the left cross-section ST relative to the first direction DR1. For example, when the inclined direction of the left cross-section ST relative to the first direction DR1 is a third direction DR3, the right cross-section is inclined in a direction symmetrical with the third direction DR3 relative to the first direction DR1.

Figure 4:
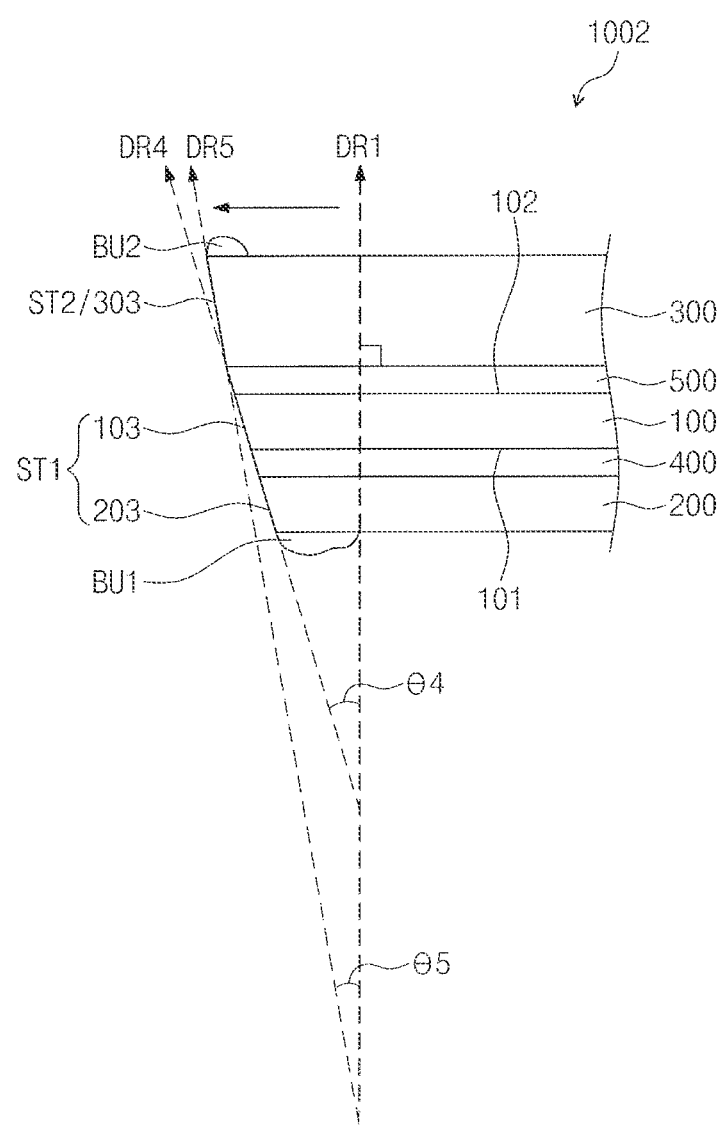
FIG. 4 illustrates another embodiment of a display device.

FIG. 4 is a cross-sectional view of another embodiment of a display device 1002 which includes a first cross-section ST1 and a second cross-section ST2 having a slope different from a slope of the first-cross-section ST1. The first cross-section ST1 corresponds to the side surface 203 of the first film 200 and the side surface 103 of the display panel 100L. The second cross-section ST2 corresponds to the side surface 303 of the second film 300.

For example, the first and second cross-sections ST1 and ST2 are inclined outwardly to be far away from the center of the display device 1002 with respect to the first direction DR1. The first cross-section ST1 inclined with respect to the first direction DR1 may be referred to as a fourth direction DR4. The second cross-section ST2 inclined with respect to the first direction DR1 may be referred to as a fifth direction DR5.

In the present exemplary embodiment, the angle between the first direction DR1 and the fourth direction DR4 may referred to as a fourth inclination angle θ4. The angle between the first direction DR1 and the fifth direction DR5 may be referred to as a fifth inclination angle θ5. The fourth and fifth angles θ4 and θ5 may be different from each other. For example, the fourth inclination angle θ4 may be greater than the fifth inclination angle θ5.

FIG. 4 shows only left first and second cross-sections ST1 and ST2 of the display device 1002, but right first and second cross-sections may be symmetrical with the left first and second cross-sections ST1 and ST2 relative to the first direction DR1. For example, the right first and second cross-sections are inclined to directions respectively symmetrical with the fourth and fifth directions DR4 and DR5 with respect to the first direction DR1.

Figure 5:
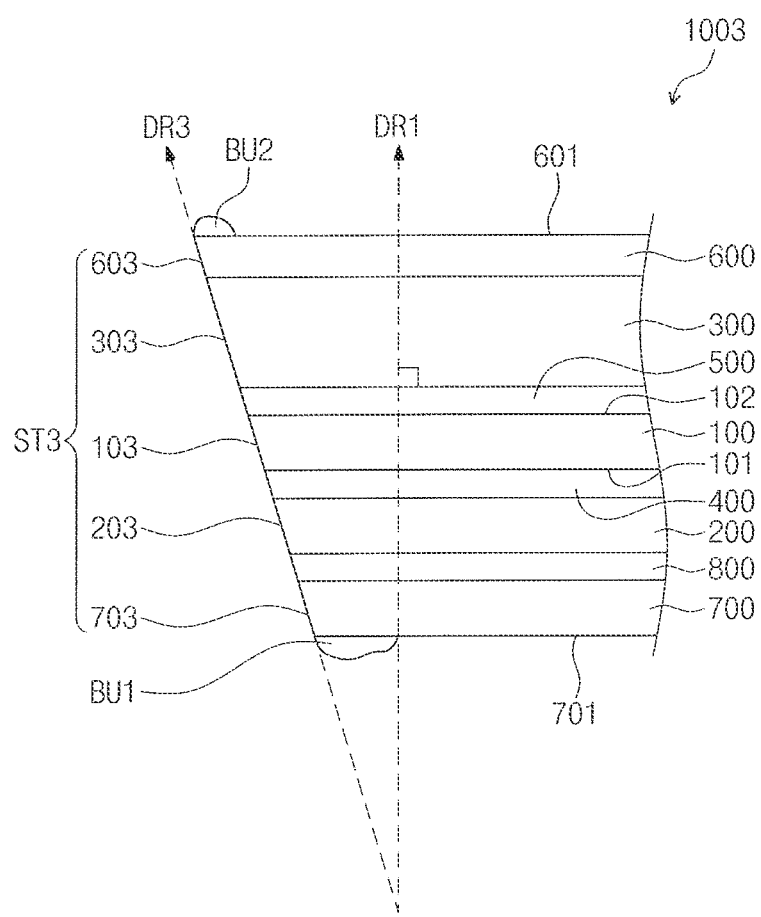
FIG. 5 illustrates another embodiment of a display device.

FIG. 5 is a cross-sectional view of another embodiment of a display device 1003 which further includes a protective film 600 protecting the second film 300, a lower support film 700 disposed under the first film 200, and a third pressure sensitive adhesive 800 disposed between the lower support film 700 and the first film 200.

The protective film 600 is on the second film 200 to protect the second film 300. The protective film 600 includes, for example, polyethylene terephthalate (PET), polyethylene naphthalate (PEN), polypropylene (PP), polycarbonate (PC), polystyrene (PS), polysulfone (PSul), polyethylene (PE), polyphthalamide (PPA), polyethersulfone (PES), polyarylate (PAR), polycarbonate oxide (PCO), or modified polythenylene oxide (MPPO).

The lower support film 700 is under the first film 200 to protect and support internal components of the display device 103 at an outermost position of the display device 103. The lower support film 700 includes, for example, polyethylene terephthalate (PET), polyethylene naphthalate (PEN), polypropylene (PP), polycarbonate (PC), polystyrene (PS), polysulfone (PSul), polyethylene (PE), polyphthalamide (PPA), polyethersulfone (PES), polyarylate (PAR), polycarbonate oxide (PCO), or modified polythenylene oxide (MPPO).

The third pressure sensitive adhesive 800 adheres the lower support film 700 to the first film 200.

A cross-section ST3 of the display device 1003 corresponds to a side surface of the lower support film 700, a side surface 203 of the first film 200, a side surface 103 of the display panel 100, a side surface 303 of the second film, and a side surface 603 of the protective film 600. The cross-section ST3 is inclined with respect to a normal line direction, e.g., the first direction DR1, of the second surface 102, which sequentially penetrates through the first film 200, the display panel 100, and the second film 300.

The cross-section ST3 is inclined outwardly away from a center of the display device 1003 with respect to the first direction DR1. For example, the cross-section ST3 is inclined in the third direction DR3 outwardly inclined with respect to the first direction DR1.

Accordingly, the side surface 303 of the second film 300 and the side surface 603 of the protective film 600 protrude outwardly more than the side surface 203 of the first film 200 with respect to the side surface 103 of the display panel 100. In addition, the side surface 103 of the display panel 100 protrudes outwardly more than the side surface 203 of the first film 200 and a side surface 703 of the lower support film 700.

A first burr BU1 may be on a lower surface 701 of the lower support film 700 and adjacent to the side surface 703 of the lower support film 700. A second burr BU2 may be on an upper surface 601 of the protective film 600 and adjacent to the side surface 603 of the protective film 600. The first and second burrs BU1 and BU2 may have different sizes, e.g., the second burr BU2 may be smaller than the first burr BU1.

Figure 6:
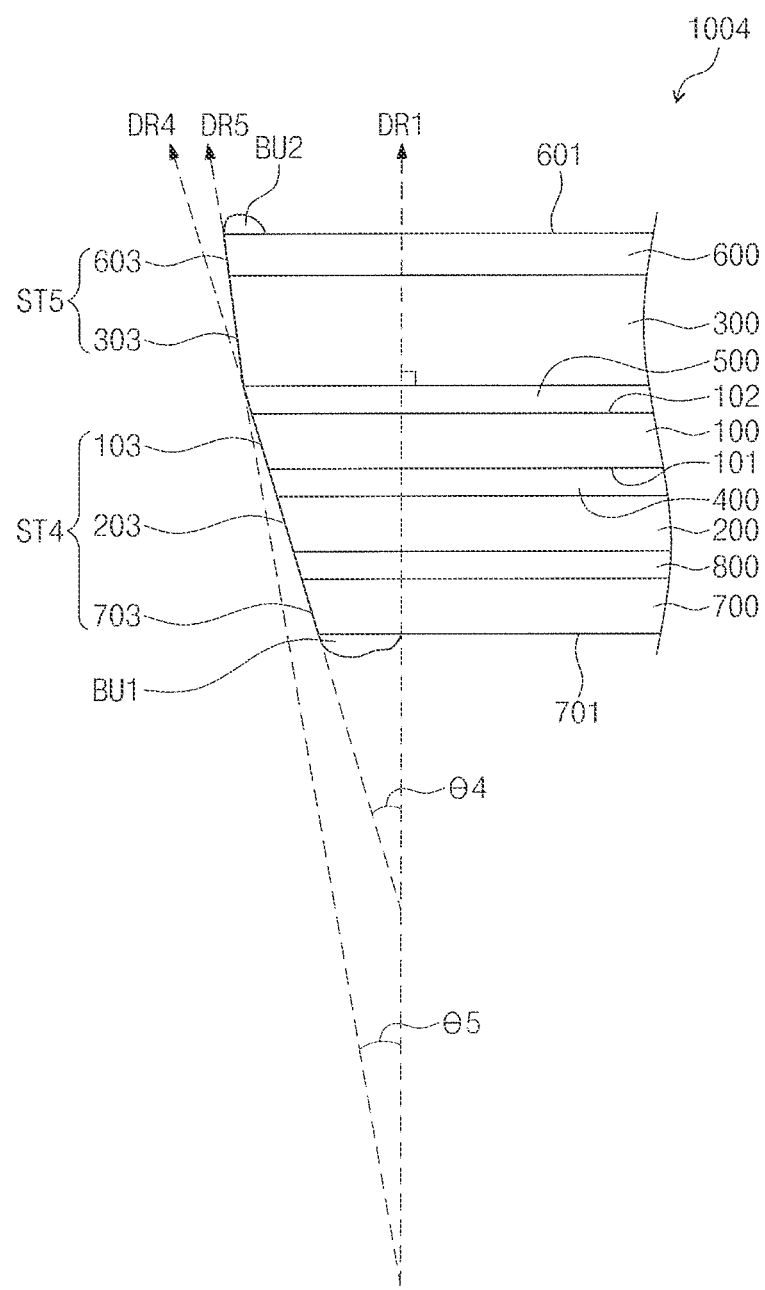
FIG. 6 illustrates another embodiment of a display device.

FIG. 6 is a cross-sectional view of an other embodiment of a display device 1004 which includes a first cross-section ST4 and a second cross-section ST5 having a slope different from a slope of the first cross-section ST4. The first cross-section ST4 corresponds to the side surface 703 of the lower support film 700, the side surface 203 of the first film 200, and the side surface 103 of the display panel 100. The second cross-section ST5 corresponds to the side surface 303 of the second film 300 and the side surface 603 of the protective film 600.

The first and second cross-sections ST4 and ST5 are inclined outwardly to be far away from a center of the display device 1004 with respect to the first direction DR1. A direction in which the first cross-section ST4 is inclined relative to the first direction DR1 may be referred to as a fourth direction DR4. A direction in which the second cross-section ST5 is inclined with respect to the first direction DR1 may be referred to as a fifth direction DR5.

The angle between the first direction DR1 and the fourth direction DR4 is a fourth inclination angle θ4. The angle between the first direction DR1 and the fifth direction DR5 is a fifth inclination angle θ5. The fourth and fifth inclination angles θ4 and θ5 may be different, e.g., the fourth inclination angles θ4 may be greater than the fifth inclination angle θ5.

Figure 7:
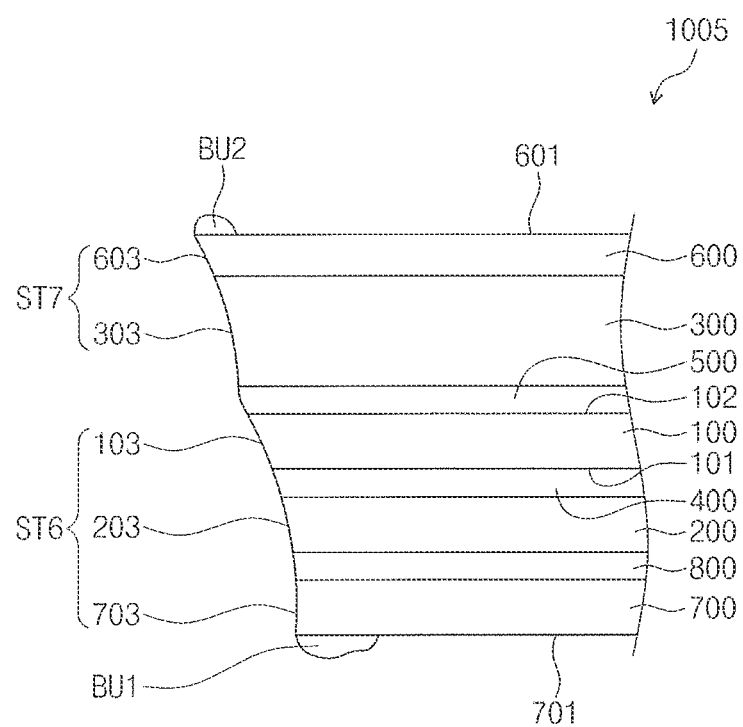
FIG. 7 illustrates another embodiment of a display device.

FIG. 7 is a cross-sectional view of another embodiment of a display device 1005 which may include a first cross-section ST6 and a second cross-section ST7 having a curvature different from a curvature of the first cross-section ST6. The first and second cross-sections ST6 and ST7 may be connected to each other. The first cross-section ST6 may include the side surface 703 of the lower support film 700, the side surface 204 of the first film 200, and the side surface 103 of the display panel 100. The second cross-section ST7 may include the side surface 303 of the second film 300 and the side surface 603 of the protective film 600.

Each of the first and second cross-sections ST6 and ST7 may have a half-parabolic shape. The curvature of the first cross-section ST6 may be different from the curvature of the second cross-section ST7 in another embodiment.

In one embodiment, the first cross-section ST6 may have a tangent slope decreasing as the distance from the display panel 100 decreases from the lower support film 700. The second cross-section ST7 may have a tangent slope decreasing as a distance from the protective film 600 decreases from the second film 300.

The side surface 703 of the lower support film 700, the side surface 204 of the first film 200, and the side surface 103 of the display panel 100, which correspond to the first cross-section ST6, may have different tangent slopes from each other. For example, a tangent slope of the side surface 703 of the lower support film 700 may be greater than a tangent slope of the side surface 204 of the first film 200, and the side surface 103 of the display panel 100, and a tangent slope of the side surface 203 of the first film 200 may be greater than a tangent slope of the side surface 103 of the display panel 100.

The side surface 303 of the second film 300 and the side surface 603 of the protective film 600, which corresponds to the second cross-section ST7, may have different tangent slopes from each other. For example, the tangent slope of the side surface 303 of the second film 300 may be greater than the tangent slope of the side surface 603 of the protective film 600.

The variation in the tangent slope of the first cross-section ST6 may be greater than the variation in the tangent slope of the second cross-section ST7, e.g., the curvature of the first cross-section ST6 may be greater than the curvature of the second cross-section ST7.

Figure 8:
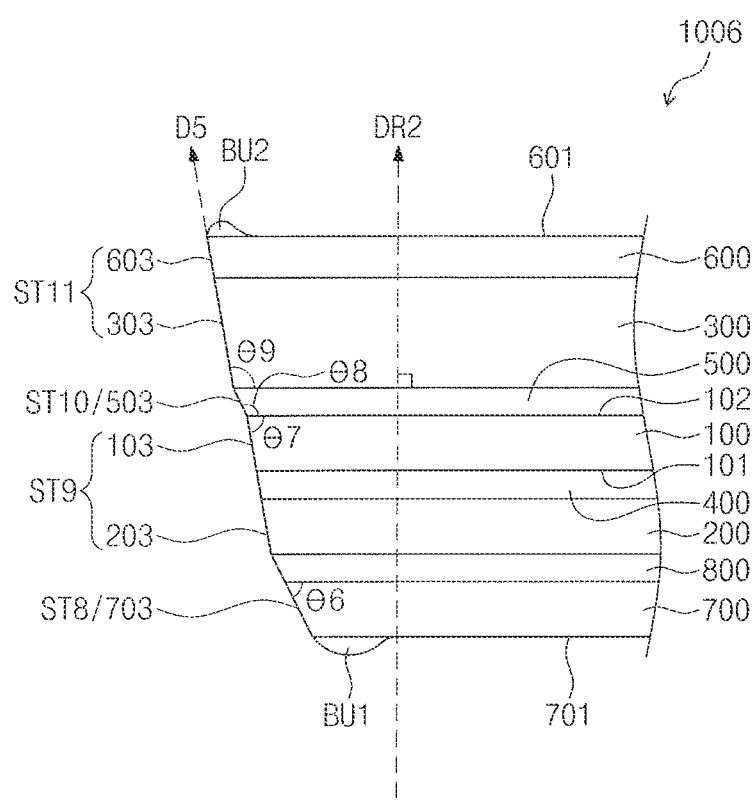
FIG. 8 illustrates another embodiment of a display device.

FIG. 8 is a cross-sectional view of another embodiment of a display device 1006 which may include at least three cross-sections having different slopes from each other. Referring to FIG. 8, the display device 1006 may include first, second, third, and fourth cross-sections ST8, ST9, ST10, and ST11.

The first cross-section ST8 includes the side surface 703 of the lower support film 700. The second cross-section ST9 includes the side surface 203 of the first film 200 and the side surface 103 of the display panel 100. The first cross-section ST8 further includes a side surface 803 of the third pressure sensitive adhesive 800. The second cross-section ST9 further includes a side surface 403 of the first pressure sensitive adhesive 400. The third cross-section ST10 includes a side surface 503 of the second pressure sensitive adhesive 500. The fourth cross-section ST11 includes the side surface 303 of second film 300 and the side surface 603 of protective film 600.

The angle between an extension line of the first cross-section ST8 and the second surface 102 may be a sixth inclination angle θ6. The angle between the second cross-section ST9 and the second surface 102 may be a seventh inclination angle θ7. The sixth and seventh inclination angles θ6 and θ7 may be less than a predetermined angle, e.g., about 90 degrees. The sixth inclination angle θ6 may be less than the seventh inclination angle θ7.

The angle between the third cross-section ST10 and the second surface 102 may be an eighth inclination angle θ8. The angle between an extension line of the fourth cross-section ST11 and the second surface 102 may be a ninth inclination angle θ9. The eighth and ninth inclination angles θ8 and θ9 may be less than a predetermined angle, e.g., about 90 degrees. The eighth inclination angle θ8 may be less than the ninth inclination angle θ9. In another example, each of the first, second, third, and fourth cross-sections ST8, ST9, ST10, and ST11 may include portions of side surfaces of two layers adjacent to each other.

FIGS. 2 to 8 illustrate cross-sectional structures of various embodiments of display devices. The cross-sectional structure may be changed in various ways as long as the side surface 303 of the second film 300 protrudes outwardly more than the side surface 303 of the first film 200 and the side surface 303 of the second film 300 is inclined at an angle greater than a predetermined angle (e.g., about 90 degrees) with respect to the second surface 102.

Figure 9:
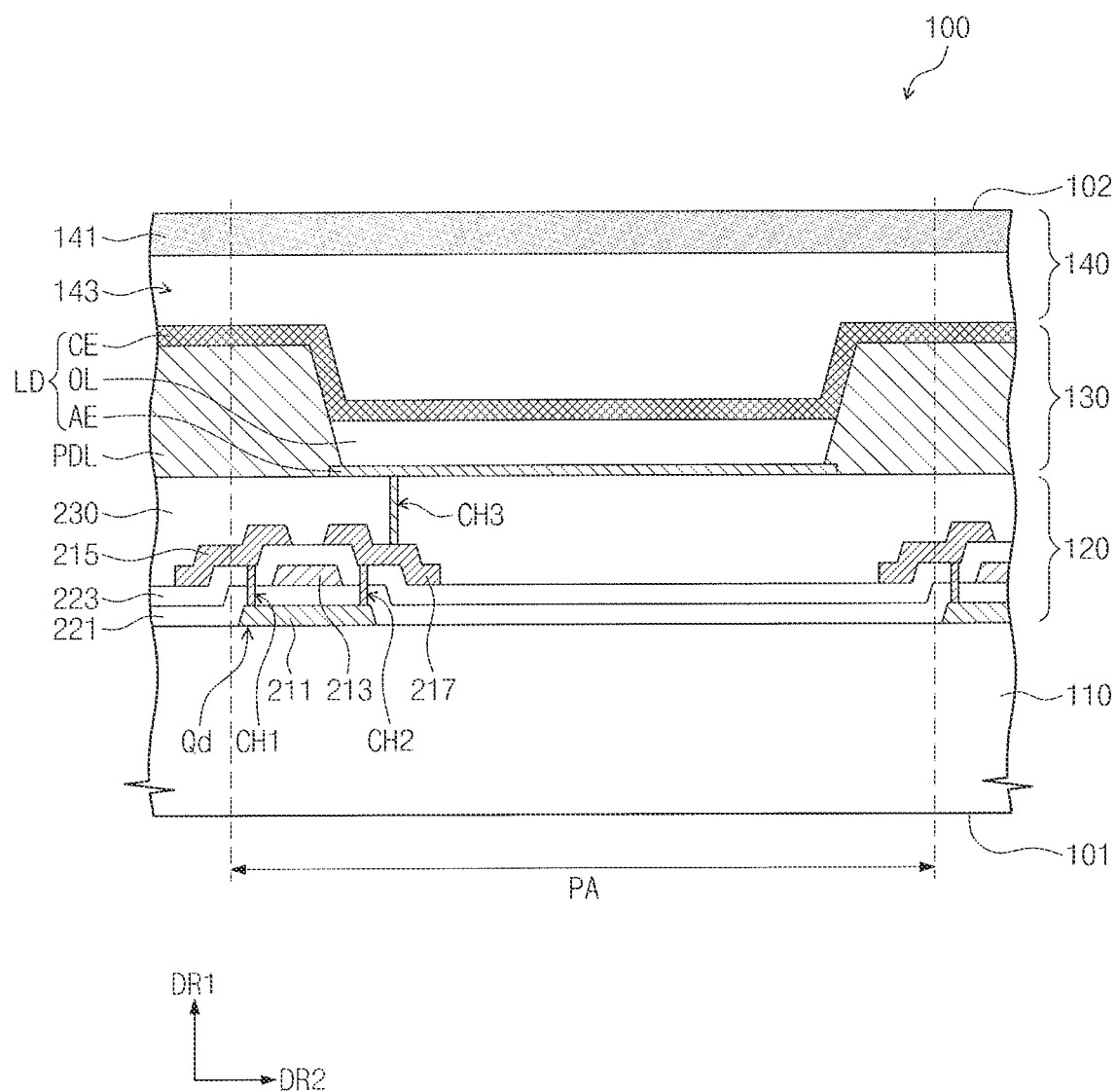
FIG. 9 illustrates an embodiment of a display panel.

FIG. 9 is a cross-sectional view of an embodiment of a display panel 100 in FIGS. 1 to 8. Referring to FIG. 9, the display panel 100 includes a base substrate 110, a driving layer 120, an organic light emitting element layer 130, and a sealing layer 140. The base substrate 110 provides the first surface 101 of the display panel 100, may be a flexible substrate, and may include a plastic material having superior thermal resistance and durability, e.g., polyethylene etherphthalate, polyethylene naphthalate, polycarbonate, polyarylate, poly etherimide, polyether sulfone, polyimide, etc. Hereinafter, the base substrate 110 includes polyimide as an illustrative case.

The driving layer 120 includes various signal lines, e.g., a scan line, a data line, a power source line, and a light emitting line. The driving layer 120 includes a plurality of transistors and a one or more capacitors. The transistors include a switching transistor and a driving transistor which are arranged in every pixel.

FIG. 9 illustrates a driving transistor Qd of the driving layer 120 as a representative example. The driving transistor Qd includes an active layer 211, a gate electrode 213, a source electrode 215, and a drain electrode 217. The active layer 211 is on the base substrate 110. The driving layer 120 further includes a first insulating layer 221 between the active layer 211 and the gate electrode 213. The first insulating layer 221 insulates the active layer 211 and the gate electrode 213. The source electrode 215 and the drain electrode 217 are on the gate electrode 213.

The driving layer 120 further includes a second insulating layer 223 between the gate electrode 213 and the source electrode 215 and between the gate electrode 213 and the drain electrode 217. The source electrode 215 and the drain electrode 217 are connected to the active layer 211 respectively through contact holes CH1 and CH2 through the first and second insulating layers 221 and 223. The driving layer 120 may further include a protective layer 230 disposed on the source electrode 215 and the drain electrode 217.

The structure of the driving transistor Qd may be different from FIG. 9 in another embodiment. Also, the positions of the active layer 211, the gate electrode 213, the source electrode 215, and the drain electrode 217 may be different in other embodiments, e.g., the gate electrode 213 may be on the active layer 211 in FIG. 9 but the gate electrode 213 may be under the active layer 211.

The switching transistor may have substantially the same structure as the driving transistor Qd. In an other embodiment, the switching and driving transistors may have different structures. For instance, an active layer of the switching transistor may be on a layer different from a layer on which the active layer 211 of the driving transistor Qd is disposed.

The organic light emitting element layer 130 includes an organic light emitting diode LD. In the present exemplary embodiment, the organic light emitting diode LD may be a front-surface light-emitting type to emit a light to an upper direction DR3.

The organic light emitting diode LD includes a first electrode AE, an organic layer OL, and a second electrode CE. The first electrode AE is on the protective layer 230. The first electrode AE is connected to the drain electrode 217 through a contact hole CH3 through the protective layer 230. The first electrode AE is a pixel electrode or a positive electrode. The first electrode AE may be a transflective electrode or a reflective electrode. When the first electrode AE is a transflective electrode or a reflective electrode, the first electrode AE may include, for example, Ag, Mg, Al, Pt, Pd, Au, Ni, Nd, Ir, Cr, or a mixture of metal.

The first electrode AE may have a single-layer structure of a metal oxide or a metal or a multi-layer structure. For example, the first electrode AE may have a single-layer structure of ITO, Ag, or a mixture of metal (e.g., a mixture of Ag and Mg), a double-layer structure of ITO/Mg or ITO/MgF, or a triple-layer structure of ITO/Ag/ITO, but it should not be limited thereto or thereby.

The organic layer OL includes an organic light emitting layer which includes a low molecular weight or high molecular weight organic material. The organic light emitting layer emits light. The organic layer OL selectively includes a hole transport layer, a hole injection layer, an electron transport layer, and/or an electron injection layer. Holes and electrons are injected into the organic light emitting layer from the first and second electrodes AE and CE, respectively. The electrons are recombined with the holes in the organic light emitting layer to generate excitons, and the organic light emitting layer emits light when the excitons transition from an excited state to a ground state.

The second electrode CE is on the organic light OL. The second electrode CE is a common electrode or a negative electrode. The second electrode may be, for example, a transmissive electrode or a transflective electrode. When the second electrode E2 is a transmissive electrode or a transflective electrode, the second electrode E2 may include, for example, Li, Liq, Ca, LiF/Ca, LiF/Al, Al, Mg, BaF, Ba, Ag, a compound thereof, or a mixture thereof, e.g., a mixture of Ag and Mg.

The second electrode CE may include an auxiliary electrode, which may include a layer formed by depositing the material to face the organic light emitting layer and a transparent metal oxide material, e.g., indium tin oxide (ITO), indium zinc oxide (IZO), zinc oxide (ZnO), indium tin zinc oxide (ITZO), etc., Mo, Ti, or Ag.

The organic light emitting element layer 130 further includes a pixel definition layer PDL on the protective layer 230. The pixel definition layer PDL overlaps a boundary of the pixel area PA, for example, from a plan view perspective.

The sealing layer is on the organic light emitting element layer 130. The sealing layer 140 provides the upper surface 102 of the display panel 100. The sealing layer 143 blocks the organic light emitting element layer 130 from external moisture and air. The sealing layer 140 includes a sealing substrate 141 and a sealing member. The sealing member is disposed along an edge of the sealing substrate 141 and seals the organic light emitting diode LD in cooperation with the sealing substrate 141. An inner space 143 defined by the sealing substrate 141 and the sealing member is maintained in a vacuum state, but this arrangement may be different in another embodiment. The inner space 143 may be filled with nitrogen (N2) or a filling member including an insulating material.

Different from the embodiment in FIG. 9, the sealing layer 140 may have a structure in which an organic layer and an inorganic layer are stacked several times. The sealing layer 140 may provide the second surface 102 of the display panel 100.

Figure 10:
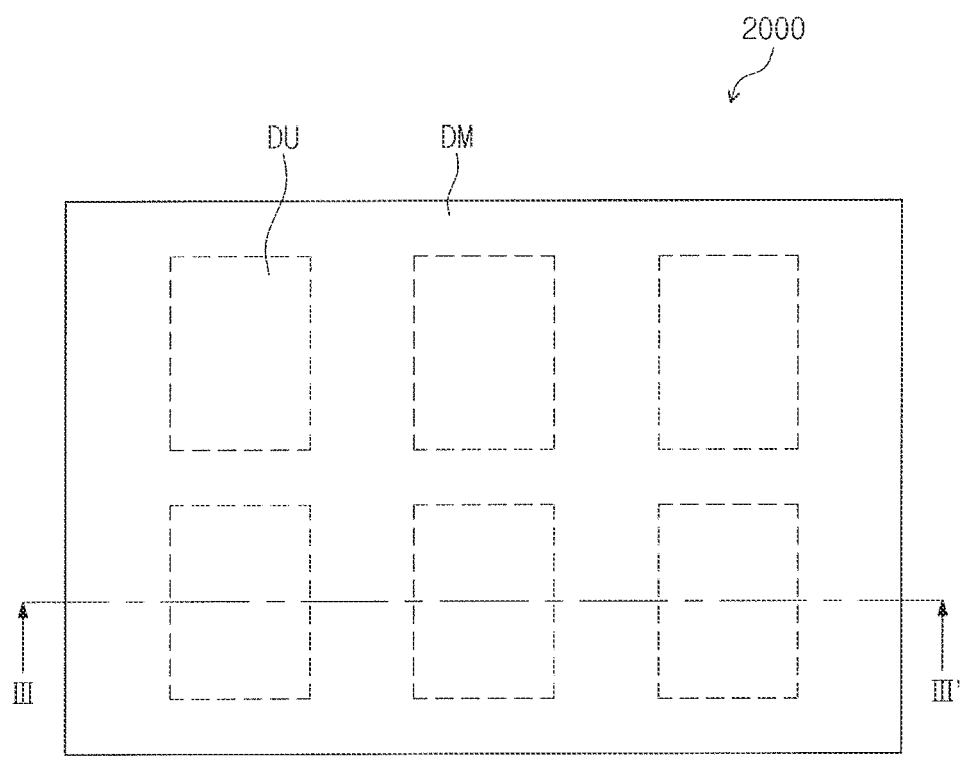
FIG. 10 illustrates an embodiment of a mother substrate with a display unit.

FIG. 10 illustrates an embodiment of a mother substrate 2000 including a display unit. FIGS. 11A to 11D are cross-sectional views corresponding to an embodiment of a method for manufacturing a display device.

Figure 11A:
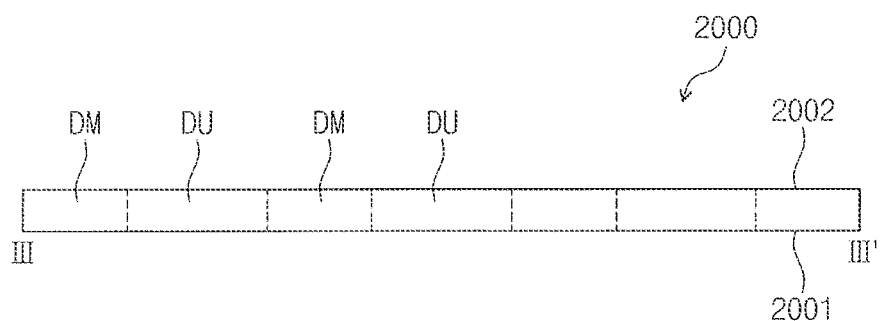
FIGS. 11A to 11D illustrate various stages in an embodiment of a method for manufacturing a display device.

Referring to FIGS. 10 and 11A, the mother substrate 2000 is formed to include a plurality of display units DU. The mother substrate 2000 further includes a dummy area DM between the display units DU or surrounding each display unit DU. Each of the display units DU includes display elements formed therein to display an image based on a signal applied thereto. The display elements may include various types of display elements. The display units DU may include, for example, the organic light emitting display element in FIG. 9.

The display elements are not in the dummy area DM. In one embodiment, the display units 1000 may be formed to share one substrate. The dummy area DM may be removed, for example, at the last stage in the manufacturing process.

FIG. 10 shows six display units DU in one mother substrate, but the mother substrate may include a different number of display units DU in another embodiment depending, for example, on the size of the display unit DU. When the display units DU are to be flexible, the mother substrate 2000 may be formed using a flexible material.

FIG. 11A is a cross-sectional view of an embodiment taken along a line III-III' in FIG. 10. Referring to FIG. 11A, three display units DU are arranged in a second direction DR2 spaced apart from each other. The dummy area DM is between two adjacent display units DU. The display units DU are cut along a dotted line to form the display panel 100 (e.g., refer to FIGS. 2 to 8), and the dummy area DM is removed after the cutting process. Each of the display units DU emits light including display information. The mother substrate 2000 includes first and second surfaces 2001 and 2002 facing each other. The second surface 2002 corresponds to a surface from which light exits.

Figure 11B:
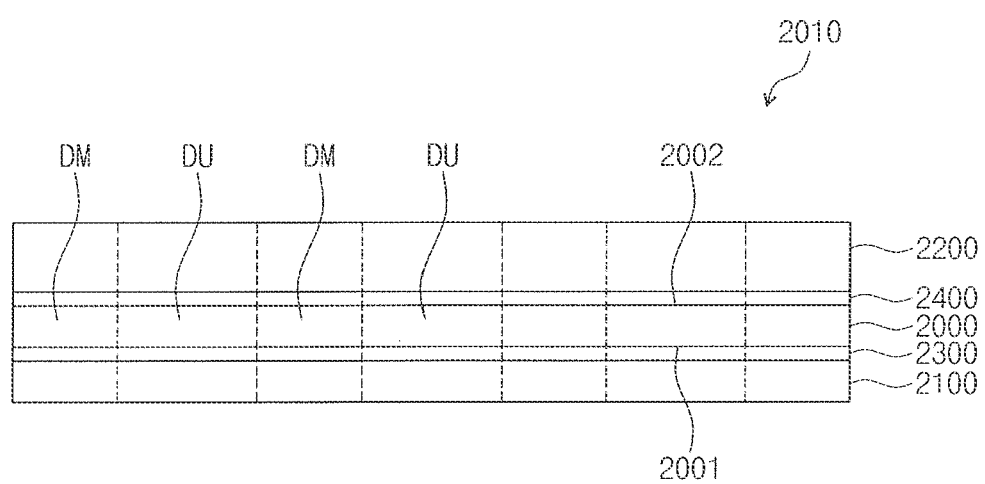

Referring to FIG. 11B, before the mother substrate 2000 is cut, first and second mother films 2100 and 2200 may be respectively attached to the first and second surfaces 2001 and 2002 of the mother substrate 2000. The first mother film 2100 is adhered to the first surface 2001 of the mother substrate 2000 by a first mother pressure sensitive adhesive 2300. The second mother film 2200 is adhered to the second surface 2002 of the mother substrate 2000 by a second mother pressure sensitive adhesive 2400. Accordingly, a display mother substrate 2010 is completed or ready for additional processes. The display mother substrate 2010 may further include a mother protective film and a mother support film in addition to the first and second mother films 2100 and 2200.

The first mother film 2100 may include, for example, polyethylene terephthalate (PET), polyethylene naphthalate (PEN), polypropylene (PP), polycarbonate (PC), polystyrene (PS), polysulfone (PSul), polyethylene (PE), polyphthalamide (PPA), polyethersulfone (PES), polyarylate (PAR), polycarbonate oxide (PCO), or modified polythenylene oxide (MPPO).

The second mother film 2200 includes a polarizing film to block external light incident thereto. The polarizing film includes a linear polarizing layer and a λ/4 retardation layer. The linear polarizing layer may be on the λ/4 retardation layer. The external light sequentially passes through the linear polarizing layer and the λ/4 retardation layer and is reflected by a lower portion (e.g., a cathode of the display panel 100) of the polarizing film. Then, the external light is suppressed since the external light does not pass through the linear polarizing layer after passing through the λ/4 retardation layer.

Figure 11C:
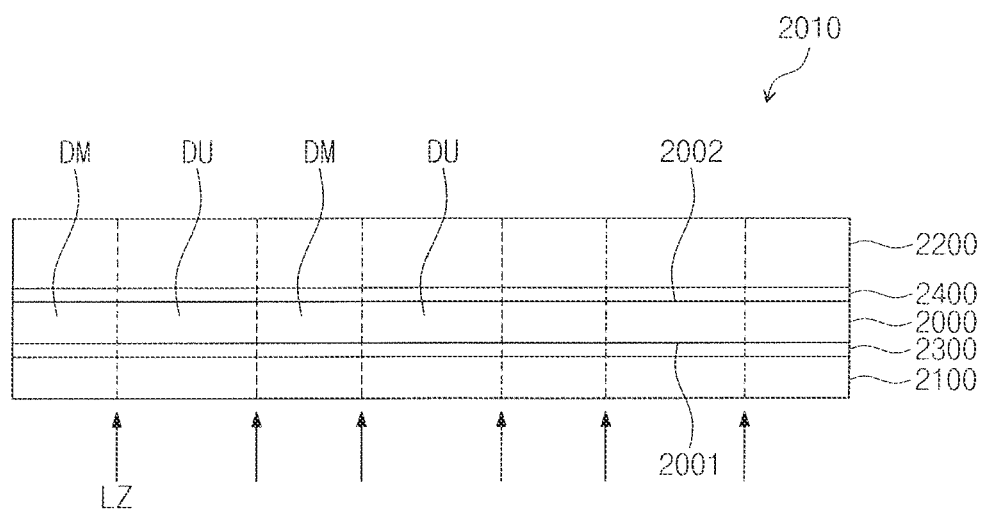

Then, as shown in FIG. 11C, a laser beam LZ is irradiated to the display mother substrate 2010 from the first mother film 2100. The laser beam LZ cuts the display mother substrate 2010. In FIGS. 11A to 11C, an area cut by the laser beam LZ is indicated by a dotted line. When the laser beam LZ is irradiated on the dotted line, the display mother substrate 2010 may be cut into the display units DU. The laser beam LZ may be, for example, at least one of a UV laser beam or a $CO_2$ laser beam.

In addition, the laser beam LZ may be irradiated in a direction from the first surface 2001 to the second surface 2002, e.g., the first direction DR1, at the side of the first mother film 2100 of the mother substrate 2000.

Figure 11D:
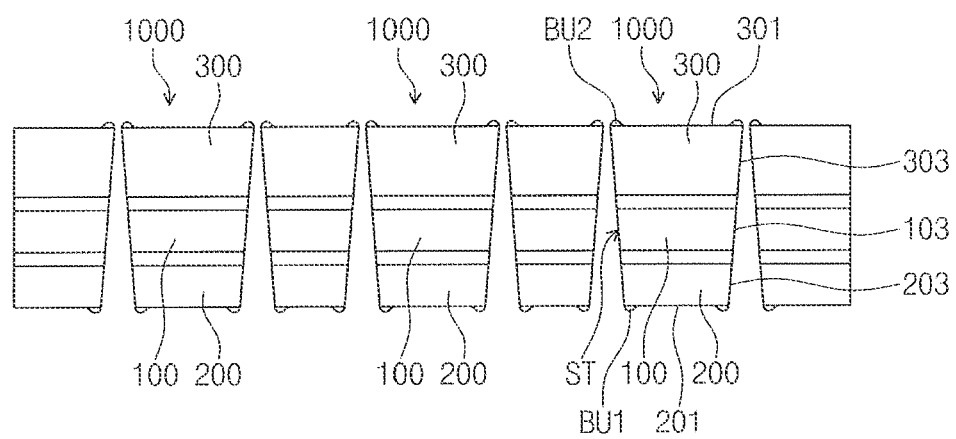
Figure 12A:
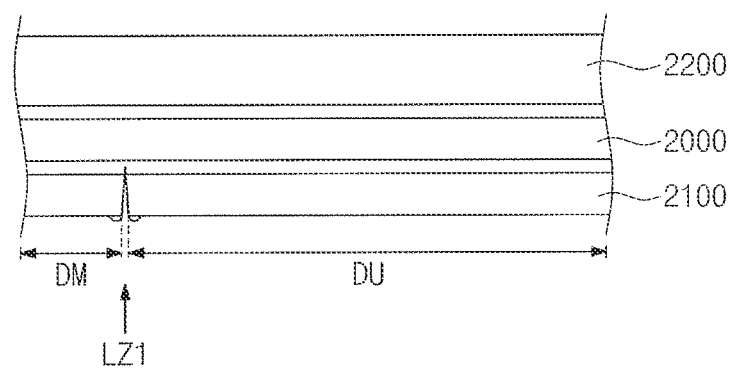
FIGS. 12A to 12D illustrate an embodiment of a cutting process.
Figure 12B:
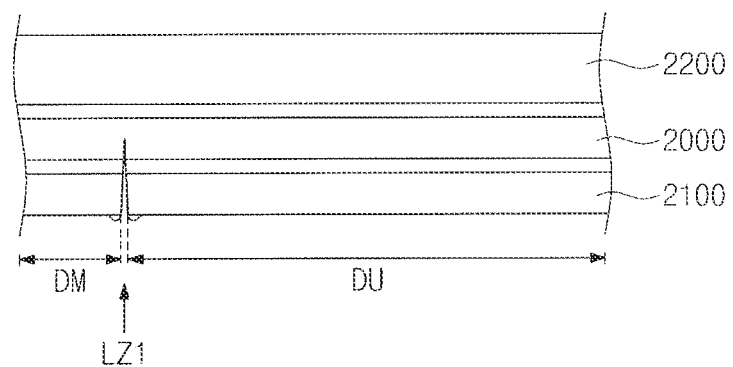
Figure 12C:
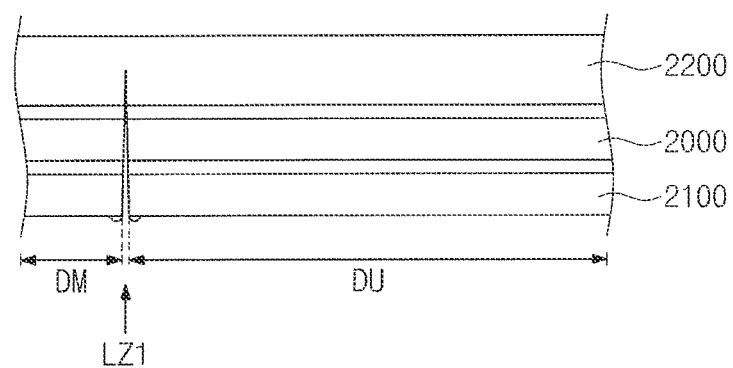
Figure 12D:
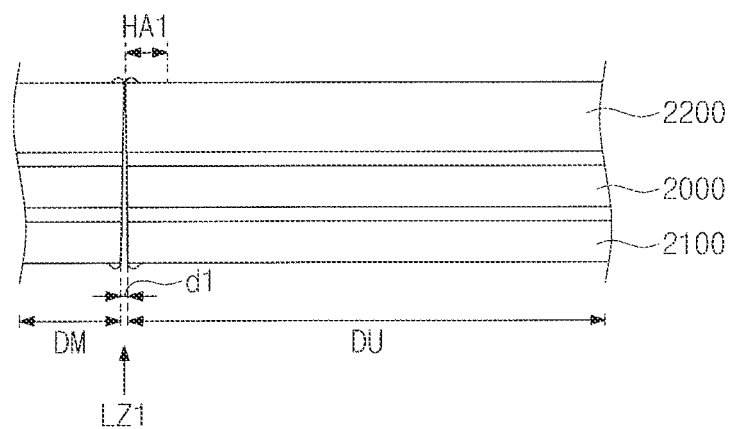

Accordingly, as shown in FIG. 11D, the display mother substrate 2010 is cut into the display units DU to form a plurality of display devices 1000. Each of the display devices 1000 includes the cross-section ST defining the side surface 203 of the first film 200, the side surface 103 of the display panel 100, and the side surface 303 of the second film 300. The cross-section ST is inclined and spaced apart from the center of the display device 1000 with respect to a normal line direction of the second surface 102, e.g., the first direction DR1, which sequentially passes through the first film 200, the display panel 100, and the second film 300.

When the display mother substrate 2010 is cut, the first and second mother films 2100 and 2200 and the first and second mother pressure sensitive adhesives 2300 and 2400 are cut into display units DU.

Due to the irradiating process of the laser beam, the first burr BU1 is formed on the lower surface 201 of the first film 200 adjacent to the side surface 203 of the first film 200. The second burr BU2 is formed on the upper surface 301 of the second film 300 adjacent to the side surface 303 of the second film 300. The sizes of the first and second burrs BU1 and BU2 are changed based on the intensity of laser beam LZ while the irradiating process of the laser beam LZ is performed. The haze area HA is in the upper surface 301 of the second film 300 adjacent to the second burr BU2. The haze area HA has a width depending on the intensity of the laser beam LZ while the irradiating process of the laser beam LZ is performed.

When the display mother substrate 2010 is cut, the distance between the dummy area DM and the display unit DU increases as the display mother substrate 2010 is cut. Since the laser beam LZ is irradiated to the first direction DR1 from the first surface 2001, the distance between the dummy area DM and the display unit DU is gradually reduced toward the first direction DR1.

As described above, when the display mother substrate 2010 is cut by irradiating the laser beam from the first mother film 2100 side, the width of the haze area HA in the upper surface 301 of the second film 300 is reduced. For example, when the laser beam is irradiated from the first mother film 2100 side, the width of the haze area HA is reduced to a greater extent than when the laser beam is irradiated from the second mother film 2200 side.

FIGS. 12A to 12D are cross-sectional views corresponding to an embodiment of a cutting method when a laser beam LZ1 with an intensity of about 5 W is irradiated six times and a width of haze area. Referring to FIGS. 12A to 12D, the display mother substrate 2010 is not completely cut when the laser beam LZ1 with the intensity of about 5 W is irradiated once, twice, or three times. The display mother substrate 2010 is completely cut after irradiating the laser beam LZ1 six times.

When the display mother substrate 2010 is completely cut by irradiating the laser beam LZ1 six times, a width of a first haze area HA1 in the upper surface 301 of the second film 300 is about 27 micrometers. The process of irradiating the laser beam several times may be referred to as a multi-pass process.

Figure 13A:
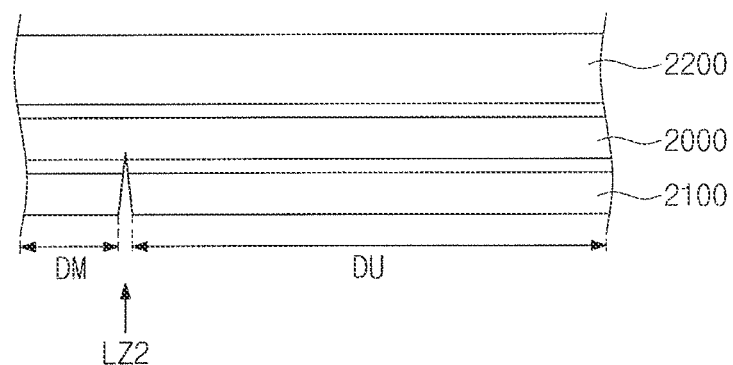
FIGS. 13A to 13C illustrate another embodiment of a cutting process.
Figure 13B:
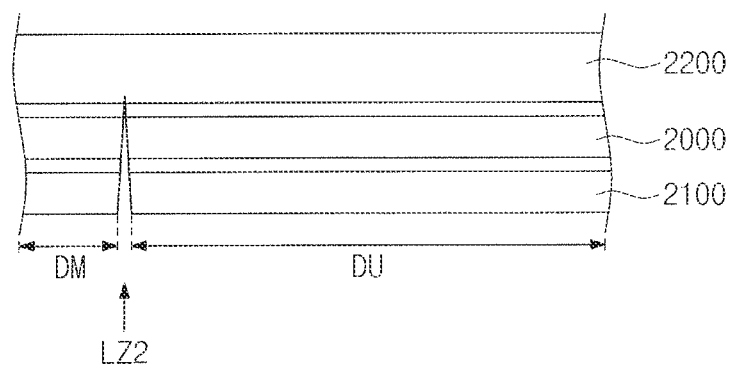
Figure 13C:
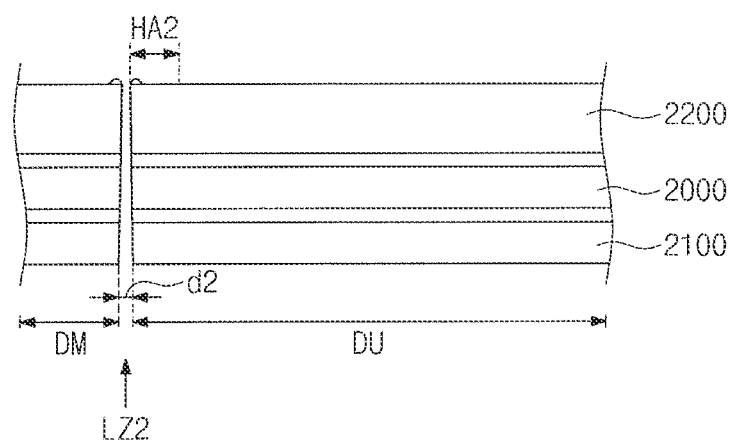

FIGS. 13A to 13C are cross-sectional views corresponding to an embodiment of a cutting process when a laser beam LZ2 with an intensity of about 10 W is irradiated three times and a width of haze area. Referring to FIGS. 13A to 13C, the display mother substrate 2010 is not completely cut when the laser beam LZ2 with the intensity of about 10 W is irradiated once or twice. The display mother substrate 2010 is completely cut after irradiating the laser beam LZ2 three times. When the display mother substrate 2010 is completely cut by irradiating the laser beam LZ2 three times, the width of a second haze area HA2 in the upper surface 301 of the second film 300 is about 45 micrometers.

Figure 14A:
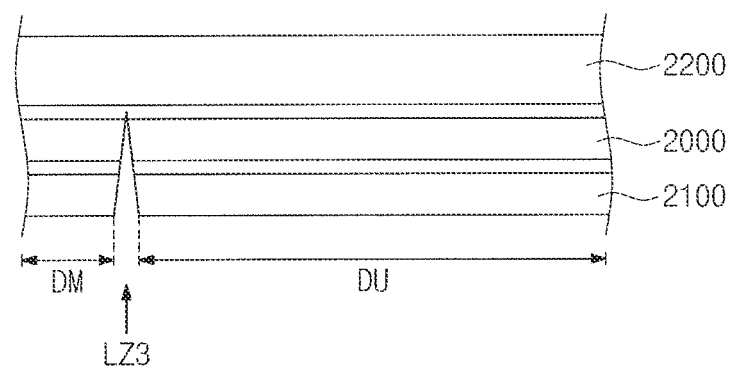
FIGS. 14A and 14B illustrate another embodiment of a cutting process.
Figure 14B:
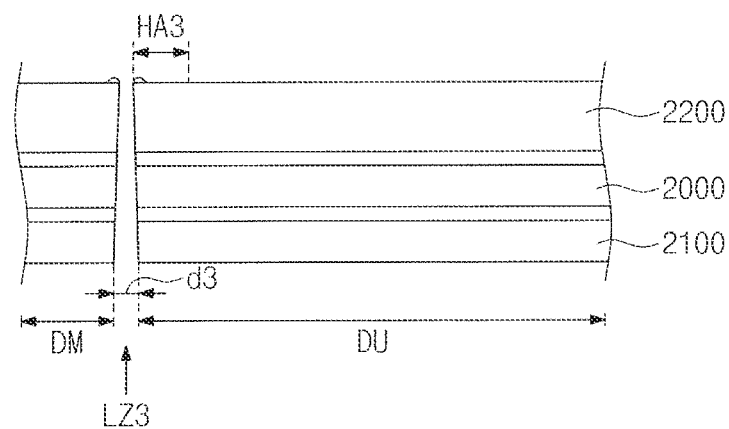

FIGS. 14A and 14B are cross-sectional views corresponding to an embodiment of a cutting process when a laser beam LZ3 with an intensity of about 20 W is irradiated two times and a width of haze area. Referring to FIGS. 14A and 14B, the display mother substrate 2010 is not completely cut when the laser beam LZ3 with the intensity of about 20 W is irradiated once. The display mother substrate 2010 is completely cut after irradiating the laser beam LZ3 twice. When the display mother substrate 2010 is completely cut by irradiating the laser beam LZ3 twice, the width of a third haze area HA3 in the upper surface 301 of the second film 300 is about 63 micrometers.

Figure 15A:
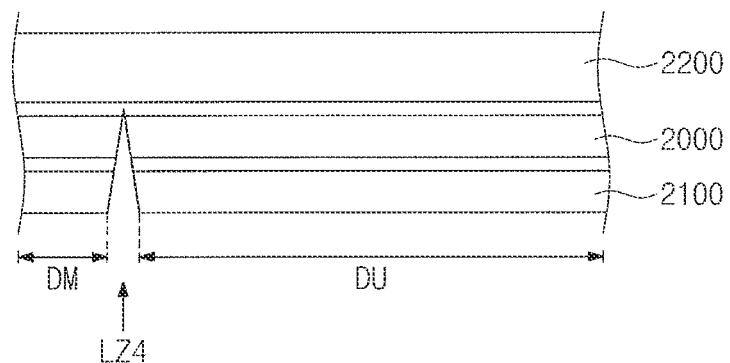
FIGS. 15A and 15B illustrate another embodiment of a cutting process.
Figure 15B:
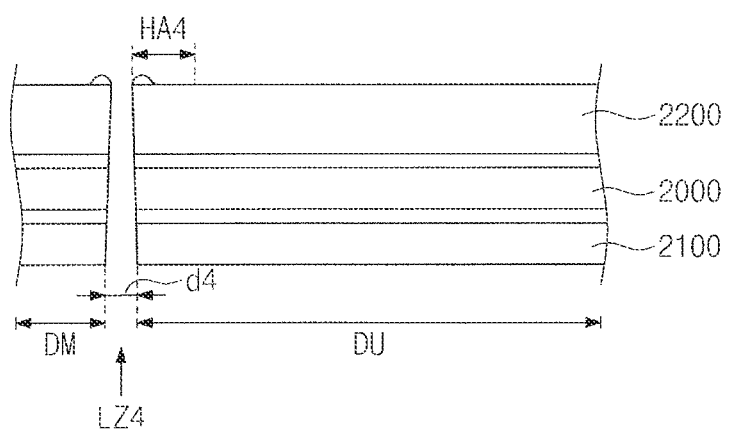

FIGS. 15A and 15B are cross-sectional views corresponding to an embodiment of a cutting process when a laser beam LZ4 with an intensity of about 30 W is irradiated two times and a width of haze area. Referring to FIGS. 15A and 15B, the display mother substrate 2010 is not completely cut when the laser beam LZ4 with the intensity of about 30 W is irradiated once. The display mother substrate 2010 is completely cut after irradiating the laser beam LZ4 twice. When the display mother substrate 2010 is completely cut by irradiating the laser beam LZ4 twice, the width of a fourth haze area HA4 in the upper surface 301 of the second film 300 is about 68 micrometers.

As illustrated in FIGS. 12A to 15B, the number of irradiation times of the laser beam increases when the intensity of the laser beam reduces. However, the width of the first haze area HA1 in the upper surface 301 of the second film 300 after the display mother substrate 2010 is cut is less than the second, third, and fourth haze areas HA2, HA3, and HA4. The size of the first and second burrs BU1 and BU2 reduces as the intensity of the laser beam reduces. The increased distances d1, d2, d3, and d4 between the dummy area DM and the display unit DU reduces as the intensity of the laser beam reduces.

Figure 16A:
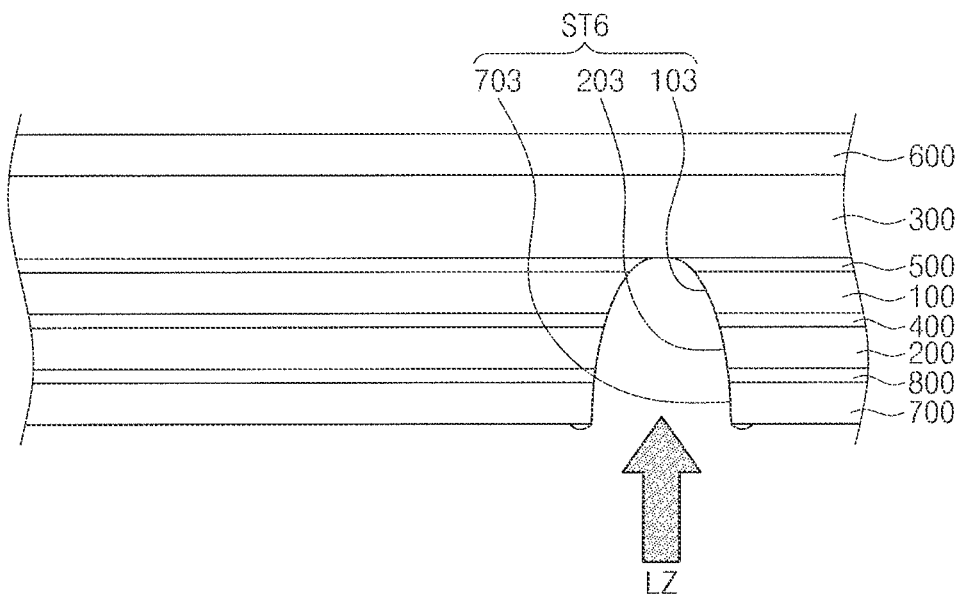
FIGS. 16A and 16B illustrate an embodiment obtained by irradiating a laser beam two times.
Figure 16B:
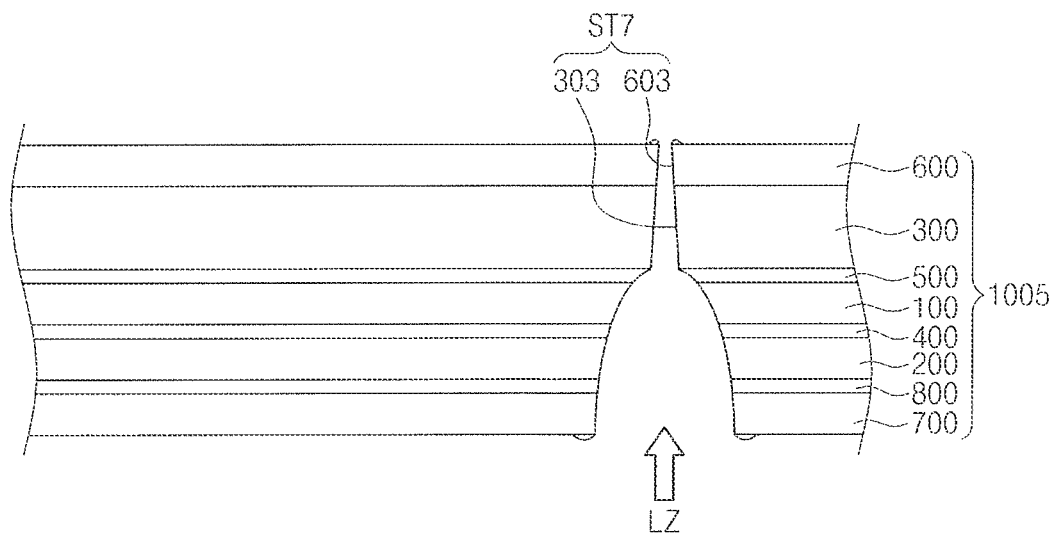

FIGS. 16A and 16B are cross-sectional views of an embodiment of a cross-sectional structure obtained by irradiating the laser beam two times. In this embodiment, the process of cutting the display mother substrate 2010 by irradiating the laser beam in FIG. 11C may include irradiating the laser beam with a first intensity and irradiating the laser beam with a second intensity as illustrated in FIGS. 16A and 16B. The second intensity may be less than the first intensity, e.g., the second intensity may be about 5 W when the first intensity is about 30 W.

In one embodiment, irradiating the laser beam with the first intensity may be performed in a first multi-pass process. Irradiating of the laser beam with the second intensity may be performed in a second multi-pass process. The second multi-pass process may be greater than the first multi-pass process. For instance, when the first multi-pass process involves irradiating the laser beam twice, the second multi-pass process may involve irradiating the laser beam five times.

As illustrated in FIG. 16A, the first mother film 2100 and the mother substrate 2000 may be cut when the laser beam is irradiated at the first intensity. Accordingly, the first cross-section ST6 may be formed to have a half-parabolic shape in the display device. Then, when the laser beam is irradiated to the second mother film 2200 at the second intensity to cut the second mother film 2200, the display mother substrate 2010 is completely cut. Thus, the second cross-section ST7 may be formed to have a half-parabolic shape in the display device connected to the first cross-section ST6. Due to the difference in intensity of the laser beam, the curvature of the first cross-section ST6 may be different from the curvature of the second cross-section ST7.

Figure 17A:
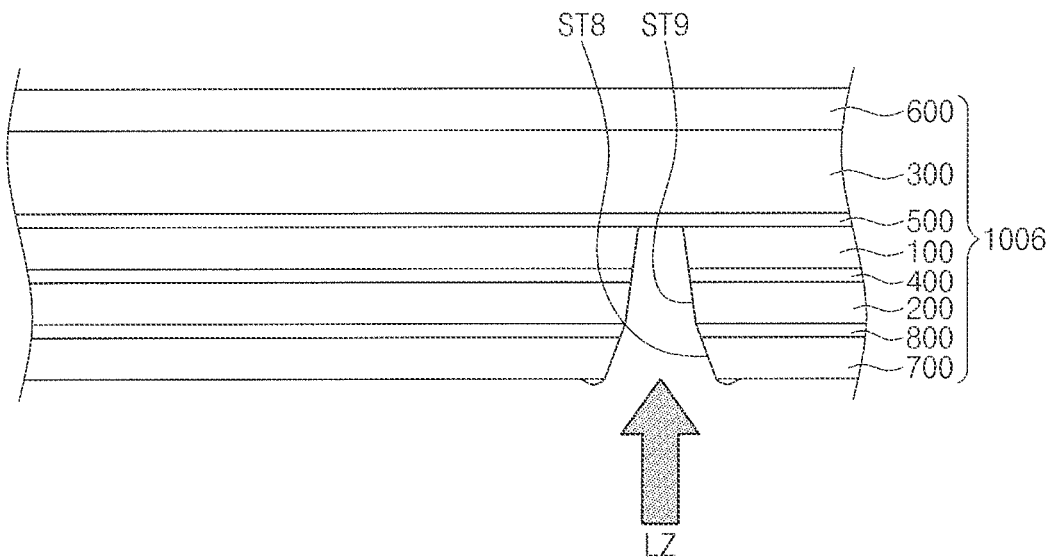
FIGS. 17A and 17B illustrate another embodiment obtained by irradiating a laser beam two times.
Figure 17B:
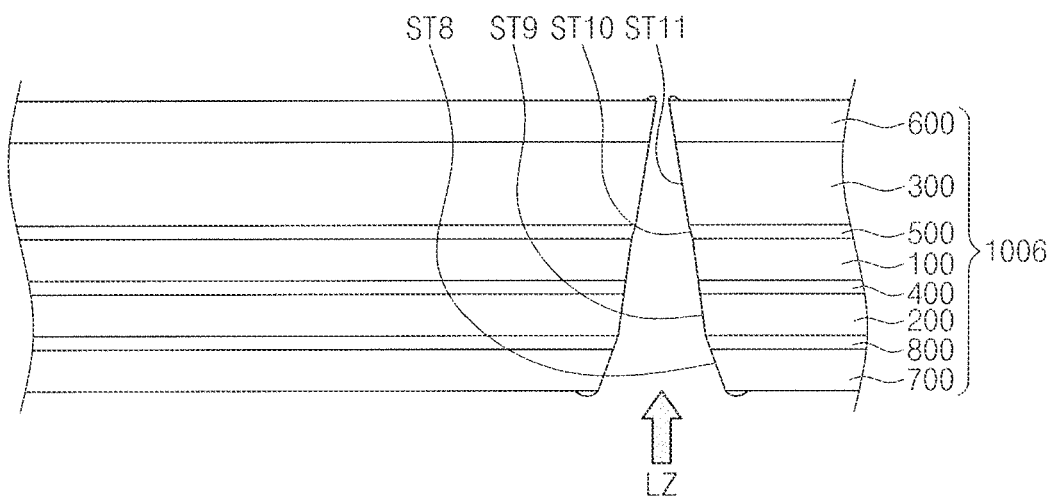

FIGS. 17A and 17B are cross-sectional views corresponding to another embodiment of a cross-sectional structure obtained by irradiating the laser beam two times. In this embodiment, cutting the display mother substrate 2010 by irradiating the laser beam in FIG. 11C may include irradiating the laser beam at the first intensity and irradiating the laser beam at the second intensity as in FIGS. 17A and 17B. The second intensity may be less than the first intensity, e.g., the second intensity may be about 10 W when the first intensity is about 30 W.

Irradiating the laser beam with the first intensity may be performed in a first multi-pass process. Irradiating the laser beam with the second intensity may be performed in a second multi-pass process. The second multi-pass process may be greater than the first multi-pass process. For instance, when the first multi-pass process involves irradiating the laser beam twice, the second multi-pass process may involve irradiating the laser beam four times.

As shown in FIG. 17A, the first mother film 2100 and the mother substrate 2000 may be cut when the laser beam is irradiated at the first intensity. Accordingly, first and second cross-sections ST8 and ST9 may be formed in the display device. Then, when the laser beam is irradiated to the second mother film 2200 at the second intensity to cut the second mother film 2200, the display mother substrate 2010 is completely cut. Thus, the third and fourth cross-sections ST10 and ST11 may be formed in the display device.

Due to the difference in intensity of the laser beam, the slope of the first cross-section ST8 may be more gentle than the slope of the third cross-section ST10. Also, the slope of the second cross-section ST9 may be more gentle than the slope of the fourth cross-section ST11.

In accordance with one or more of the aforementioned embodiments, when the display mother substrate is cut by a laser beam irradiated from a first mother film side, the width of a haze area in an upper surface of the second film is reduced. For example, the width of the haze area in the image display surface of the display device may be greatly reduced compared to the case where the laser beam irradiated from the second mother film side. As a result, the bezel width of the display device may be reduced. In accordance with at least one embodiment, a display device is formed to have a haze area with a reduced width.

Example embodiments have been disclosed herein, and although specific terms are employed, they are used and are to be interpreted in a generic and descriptive sense only and not for purpose of limitation. The embodiments (or portions thereof) may be combined to form additional embodiments. In some instances, features, characteristics, and/or elements described in connection with a particular embodiment may be used singly or in combination with features, characteristics, and/or elements described in connection with other embodiments unless otherwise indicated. Accordingly, various changes in form and details may be made without departing from the spirit and scope of the embodiments set forth in the claims.

What is claimed is:

1. A display device, comprising:
    a display panel including a first surface, a second surface opposite to the first surface, and an outermost side surface;
    a first film under the first surface of the display panel; and
    a polarizing film on the second surface of the display panel, wherein
    the polarizing film has a haze area including a yellow area extending along an edge of the polarizing film on a plane and spaced apart from the edge of the polarizing film at a predetermined space, and
    the polarizing film includes a burr disposed in the predetermined space and surrounding the yellow region.
2. The display device as claimed in claim 1, wherein a width of the haze area is 1 μm or more and 100 μm or less.
3. The display device as claimed in claim 1, wherein
    the polarizing film includes a lower surface and an upper surface further from the display panel than the lower surface of the polarizing film, and an outermost side surface,
    the polarizing film has a display area adjacent the haze area, and
    the haze area is more adjacent to the outermost side surface of the polarizing film than the display area.
4. The display device as claimed in claim 1, wherein the first film includes a first burr disposed along an edge of the first film adjacent to an outermost side surface of the first film.
5. The display device as claimed in claim 4, wherein the burr is disposed relatively outside of the first burr.
6. The display device as claimed in claim 4, wherein a width of the first burr is greater than a width of the burr.
7. The display device as claimed in claim 4, wherein the first burr is overlapping the yellow area on a plane.
8. The display device as claimed in claim 2, wherein the outermost side surface of the first film, the outermost side surface of the display panel, and the outermost side surface of the polarizing film are inclined with respect to the first surface of the display panel.
9. The display device as claimed in claim 8, wherein the outermost side surface of the display panel, the outermost side surface of the first film, and the outermost side surface of the polarizing film are connected to each other.
10. The display device as claimed in claim 8, wherein one of the outermost side surface of the display panel, the outermost side surface of the first film, and the outermost side surface of the polarizing film has a first angle with respect to the first surface of the display panel, and another one of the outermost side surface of the display panel, the outermost side surface of the first film, and the outermost side surface of the polarizing film has a second angle different from the first angle with respect to the first surface of the display panel.
11. The display device as claimed in claim 8, wherein one of the outermost side surface of the display panel, the outermost side surface of the first film, and the outermost side surface of the polarizing film has a curvature.
12. The display device as claimed in claim 1, wherein the first film includes polyethylene terephthalate (PET).
13. The display device as claimed in claim 1, wherein the yellow area has a yellow color.
14. A method for manufacturing a display device, comprising:
    forming a mother substrate including a plurality of display units, each of the display units including a plurality of light emitters;
    attaching a mother polarizing film to a first surface of the mother substrate; and
    irradiating a laser beam on the mother substrate and the mother polarizing film to laser cut the mother substrate and the mother polarizing film into individual display units, wherein the each of the display units includes a display panel separated from the mother substrate and a polarizing film separated from the mother polarizing film, and
    irradiating the laser beam on the mother polarizing film causes a burr to be formed adjacent to a side surface of the polarizing film, and
    the polarizing film has a haze area including a yellow area extending along an edge of the polarizing film on a plane and spaced apart from the edge of the polarizing film at a predetermined space, and the burr disposed in the predetermined space and surrounding the yellow region.
15. The method as claimed in claim 14, wherein the yellow area has a yellow color.
16. The method as claimed in claim 15, wherein the first film includes a first burr disposed along an edge of the first film adjacent to an outermost side surface of the first film.
17. The method as claimed in claim 14, wherein irradiating the laser beam includes:
    irradiating the laser beam with a first intensity to perform a first laser cut; and
    irradiating the laser beam with a second intensity to perform a second laser cut, the second intensity being less than the first intensity.
18. The method as claimed in claim 14, wherein the laser beam is irradiated in a multi-pass process.
19. The method as claimed in claim 18, wherein:
    irradiating the laser beam with the first intensity is performed in a first multi-pass process, and
    irradiating the laser beam with the second intensity is performed in a second multi-pass process, the second multi-pass process being greater than the first multi-pass process.
20. The method as claimed in claim 19, wherein:
    the mother polarizing film and the mother substrate are cut by irradiating the laser beam with the first intensity.

* * * * *